United States Patent [19]  [11] 4,349,754
Bull  [45] Sep. 14, 1982

[54] ACTUATION RATE LIMITER
[75] Inventor: Jeffrey F. Bull, Voorhees, N.J.
[73] Assignee: RCA Corporation, New York, N.Y.
[21] Appl. No.: 153,631
[22] Filed: May 27, 1980
[51] Int. Cl.³ ...................... H03K 17/16; H03K 17/26
[52] U.S. Cl. .................................. 307/443; 307/470; 307/517; 328/74
[58] Field of Search ................ 328/109, 74, 110, 111, 328/138; 307/470, 517, 442, 443

[56] References Cited
U.S. PATENT DOCUMENTS 3,226,577  12/1965  Azuma et al. ...................... 328/110
3,296,525  1/1967   Sakuma ............................. 307/517
3,755,747  8/1973   Letosky ............................ 307/517
3,943,382  3/1976   Hermansdorfer et al. ......... 328/138
3,958,183  5/1976   Schaefer .......................... 328/138

Primary Examiner—John S. Heyman
Attorney, Agent, or Firm—Samuel Cohen; Robert L. Troike; Christopher L. Maginniss

[57] ABSTRACT

An apparatus for limiting the rate at which changes on an input signal are applied to the input of a load device. The input signal is clocked out of a D-type flip-flop which output provides the device actuating signal and is also applied to a means for providing a pulse of determinable duration in response to transitions on the flip-flop output signal. During the occurrence of this pulse, the clock signal to the flip-flop is inhibited, preventing a rapid sequence of transitions on the input signal from causing a correspondingly rapid sequence of load device actuations.

9 Claims, 4 Drawing Figures

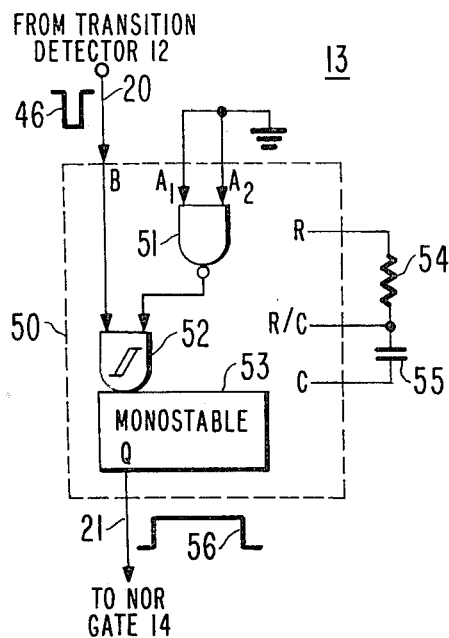
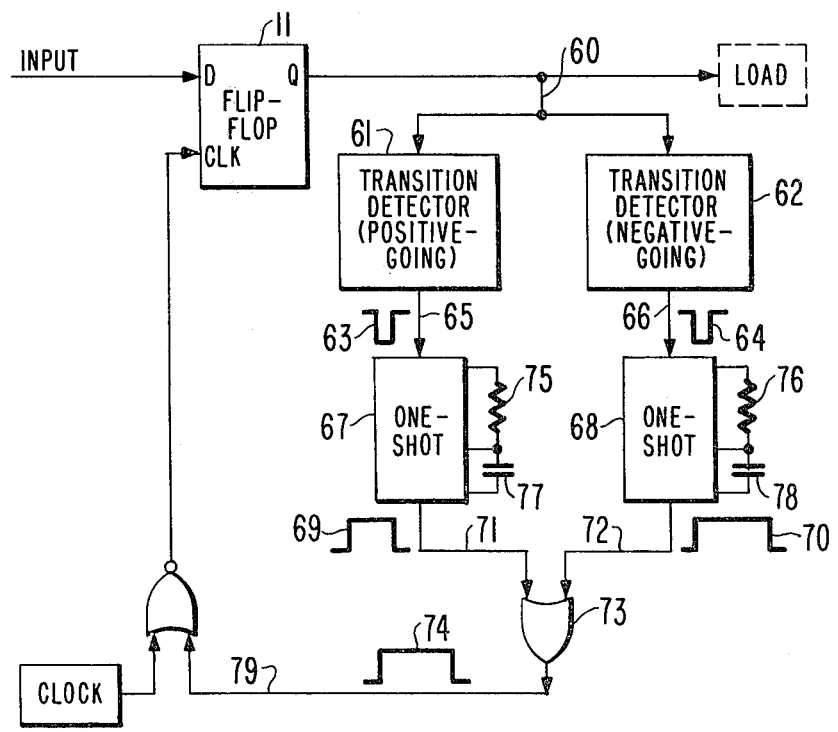
Fig. 3.
Fig. 4.

ACTUATION RATE LIMITER

The Government has rights in this invention pursuant to Contract No. DAAK40-78-C-0213 awarded by the Department of the Army.

The present invention relates to actuation rate limiters and, more particularly, to a circuit which inhibits changes in a device actuating signal for a determinable length of time following the actuation.

Most electro-mechanical devices, in which an electrical signal applied at the device input causes a mechanical motion, have very limited lifetimes in terms of number of operations, ranging from several thousand operations for a waveguide switch, to hundreds of thousands for a high-current relay, to a few million for a dry circuit reed relay. It is therefore important for the device to be controlled to the extent that spurious noise on the electrical signal does not cause unwanted actuations of the device, thereby exhausting its useful life and conveying false information.

Two examples of noise which can cause unwanted actuations are (1) ringing on the signal line following a signal transition causing a device actuation each time the signal crosses the device threshold level, and (2) a failure mode at the source of the electrical signal which causes the signal to oscillate rapidly through the threshold or to subside at the device threshold level. Although both types of noise have a significant effect on the lifetime of the device, the latter type may cause its demise within a matter of minutes.

One solution to this problem has been to interpose a triggerable flip-flop between the actuating signal and the load device, and clock the flip-flop at a rate sufficiently low that once the signal has been clocked into the flip-flop, all of the ringing caused by the signal transition will have ceased before a second occurrence of the clock signal. This solution does not adequately resolve the problem presented by the oscillatory signal failure mode, and a low frequency clock introduces a possibly unacceptably long delay between the occurrence of the signal and the actuation of the device.

U.S. Pat. No. 3,697,139, of Elliott et al., describes a limiter circuit used in an adaptive braking system which regulates the pressure in the brake cylinder for the purpose of skid prevention. When the brakes are applied and a sensor detects an imminent skid condition, a signal is generated through the limiter circuit which operates a solenoid valve of a modulator decreasing the pressure in the brake cylinder. Once the solenoid value has been actuated, subsequent cycles of the modulator for the same brake application will be inhibited by the limiter circuit until a time has elapsed, in order to rebuild the brake pressure in the cylinder. It is to be noted that the Elliott et al. patent provides a limitation on the rate of application of an electrical signal only from one voltage level to a second voltage level.

In accordance with one embodiment of the present invention an apparatus which limits the rate at which transitions on an input signal are applied to the output thereof. The apparatus includes a first means for providing an input signal at the output thereof upon the occurrence of a clock signal. A generator is responsive to particular changes of the input signal for generating a signal pulse of predetermined duration. The clock signal, whose period is less than the duration of the signal pulse, is inhibited from being applied to the first means for the duration of the signal pulse, thereby blocking subsequent changes of the input signal from being clocked to the output for a fixed length of time.

In the drawing:

FIG. 3 is a logic diagram of a one-shot generator in the embodiment of FIG. 1; and FIG. 4 is a block diagram of an actuation rate limiter according to a second embodiment of the instant invention.

Figure 1:
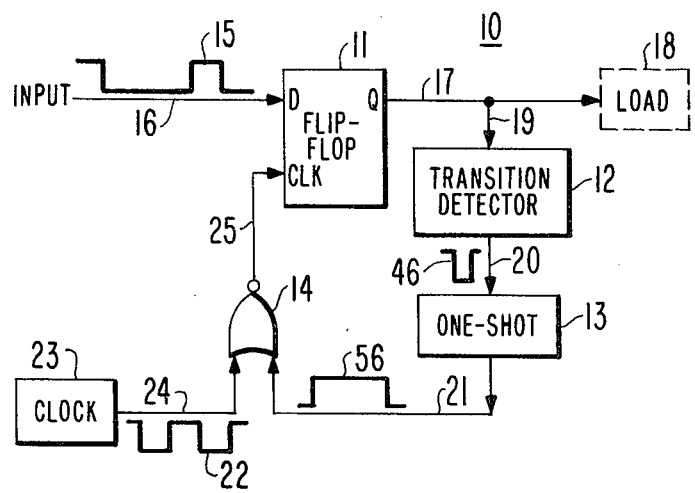
FIG. 1 is a block diagram of an actuation rate limiter according to a preferred embodiment of the instant invention.

Referring to FIG. 1 a block diagram is shown of the preferred embodiment of the applicant's invention for limiting the rate at which transitions on an input signal are applied to an output signal. An input signal 15 which for the example is a logic "one" or logic "zero" level on lead 16 is applied to the D input of a D-type flip-flop 11, which is clocked by the signal on lead 25. A logic "one" level may be for example a +5 volt level and a logic "zero" level at ground potential. D-type flip-flop 11 is a bistable multivibrator having an additional clock input where a positive-going transition of the signal at the CLK input of flip-flop 11 transfers the logic state of the signal present at the D input at the time of the transition to the Q output. The signal at the Q output of flip-flop 11, on lead 17, is applied to the load 18 (shown in dashed lines) and also to the input of a transition detector 12 via lead 19. Transition detector 12 produces a short duration logic zero level pulse at its output in response to either a positive-going (going from a logic zero to a logic one level) or a negative-going (going from a logic one to a logic zero level) transition of the signal at its input. The output signal of transition detector 12 is a pulse 46 of short duration on lead 20 which is applied to the input of one-shot generator 13. One-shot generator 13 is a monostable multivibrator. This generator is responsive to a positive-going transition of the signal at its input to produce a single logic one level pulse of predetermined duration at its output. One-shot generator 13 produces a pulse 56 of selectable length in response to the trailing edge of the short-duration pulse from transition detector 12. The pulse 56 is applied via lead 21 to one input of NOR gate 14. NOR gate 14 is a logic gate which provides a logic one level at its output only in response to simultaneous logic zero level signals at its inputs; otherwise, the signal at its output is at a logic zero level. A clocking signal 22 from clock source 23 is applied via lead 24 to the other input of NOR gate 14. The clock frequency is 1 KHz with a 10 microsecond-wide pulse. The pulse 46 on lead 20 at the output of transistion detector 12 must be less than the period of input clock signal 22. The duration of the pulse 56 from one-shot generator 13 is greater than the period of input clock signal 22 and the polarity (logic one level) of that pulse 56 is such as to inhibit the gating of the input clock signal 22 through NOR gate 14 to lead 25. Expressed another way, input clock signal 22 appears inverted on lead 25 whenever the pulse at the output of one-shot generator 13 is absent. The gated clock signal on lead 25 from NOR gate 14 is applied to the CLK input of flip-flop 11 for the purpose of clocking the input signal 15 at the D input of that flip-flop 11 to its Q output.

Referring to FIG. 1 input signal 15 is at a logic one (high) or logic zero (low) level. In the present application, the load device 18 is a mechanical relay. A logic one level input signal 15 results in a mechanical motion in one direction within relay 18, and a logic zero level input signal 15 results in a motion of the relay in the other direction. Input signal 15 is applied to the D input of flip-flop 11 via lead 16. Upon the occurrence of a positive-going transition of the clock signal on lead 25, which is applied to the CLK input of flip-flop 11, the logic level of the signal on lead 16 is provided at the Q output of flip-flop 11, on lead 17. This signal on lead 17 is applied to load device 18, and to the transition detector 12 via lead 19.

Figure 2:
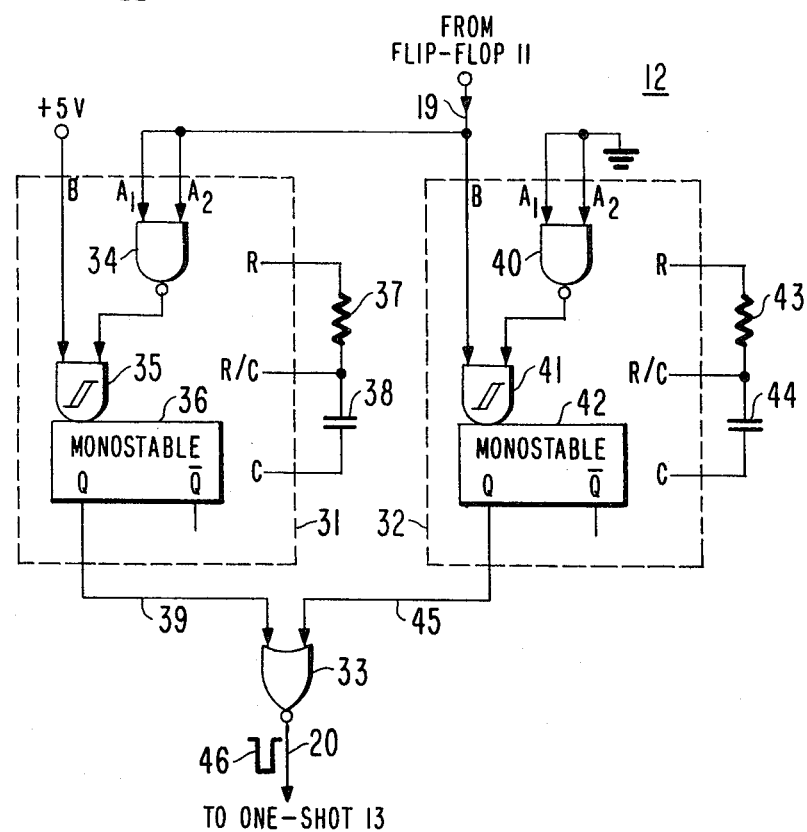
FIG. 2 is a logic diagram of a transition detector in the embodiment of FIG. 1.

Referring now to FIG. 2, transition detector 12 is for example a combination of two type 74121 monostable multivibrator circuits 31 and 32 and a type 7402 2-input NOR gate 33. These logic elements are for example Transistor-Transistor Logic (TTL) 7400 series digital logic made by, for example, Texas Instruments Incorporated, Houston, Tex. TTL logic generally operates at a $V_{CC}$ level of 5 volts above ground. Although circuit parameters vary widely, a high or logic one level input or output will be thought of as +5 volts and a low or logic zero level input or output will be 0 volts, or ground. Lead 19 is connected to both inputs $A_1$ and $A_2$ of type 74121 monostable multivibrator circuit 31. These inputs are coupled to a NAND gate 34 in circuit 31. A logic one to logic zero level transition of the signal on lead 19 will result in a low-to-high (logic zero to logic one) level transition at the output of NAND gate 34, which is applied to one input of AND gate 35 also part of circuit 31. The other input of AND gate 35, the B input of monostable multivibrator circuit 31 is tied to +5 volts reference voltage from a source, setting it at a permanent logic one level. The combination of these conditions at the inputs of AND gate 35 results in a low-to-high (zero to one level) transition of the signal at its output, which is directly coupled to the input of monostable multivibrator 36 also part of circuit 31. The operation of monostable multivibrator 36 is such that a pulse of a logic one or high level will appear at its normally-low Q output in response to a low-to-high transition at its input.

A somewhat similar analysis can be made of monostable multivibrator circuit 32 which for the example is also a type 74121 circuit. Inputs $A_1$ and $A_2$ of type 74121 type circuit are connected to ground resulting in a high or logic one level at the output of a NAND gate 40 which is part of circuit 32. The output of NAND gate 40 is applied as one input to an AND gate 41 which is part of circuit 32. The other input to AND gate 41 of circuit 32 is the B input of monostable multivibrator circuit 32, which is connected to lead 19. A low-to-high logic level transition of the signal on lead 19 will result in a low-to-high transition of the signal at the output of AND gate 41 of circuit 32, which is directly coupled to the input of monostable multivibrator 42 of circuit 32. As was described above for monostable multivibrator 36, the low-to-high transition at the input of monostable multivibrator 42 will result in a pulse of high or logic one level at its normally-low Q output.

Resistor 37 and capacitor 38 connected to monostable multivibrator circuit 31, and resistor 43 and capacitor 44 connected to monostable multivibrator circuit 32 perform the function of regulating the width of the pulse generated by monostable multivibrators 36 and 42, respectively. A graph relating values of resistance and capacitance to pulse duration can be found on page 6–67 of the TTL Data Book for Design Engineers, Second Edition, published in 1976 by Texas Instruments Incorporated. In the present embodiment, applicant selected values of 10 K ohm for resistors 37 and 43, and 100 picofarads for capacitors 38 and 44, resulting in a pulse duration of approximately one microsecond from each multivibrator 36 and 42.

The signals at the Q outputs of monostable multivibrators 36 and 42 are connected, via leads 39 and 45, respectively, to the inputs of NOR gate 33. A high (one) logic level pulse at either input will result in a low (zero) logic level pulse 46 at the output of NOR gate 33, which is applied to lead 20. In summary, the overall effect of transition detector 12 is to provide a zero logic level pulse 46 at lead 20 in response to either a high-to-low or low-to-high transition of the signal on lead 19.

Referring now to FIG. 3, one-shot generator 13 is comprised of for example a Texas Instruments Incorporated type 74121 monostable multivibrator circuit 50 and resistor 54 and capacitor 55. Input $A_1$ and $A_2$ of monostable multivibrator circuit 50 are connected to ground, resulting in a high logic level of the signal at the output of NAND gate 51 within circuit 50 which is applied to one input of AND gate 52 also part of circuit 50. The other input of AND gate 52 is the B input of monostable multivibrator 50, connected to lead 20. The low logic level pulse 46 at lead 20 causes a low logic level pulse at the output of AND gate 52. Monostable multivibrator 53 of circuit 50 responds to low-to-high signal transitions (the trailing edge of pulse 46) to generate a high logic level pulse 56 at the Q output. A delay has thus been introduced after the high-to-low or low-to-high transition of the signal on lead 19 by the detector 12 (in FIG. 2) before the generation of the high logic level pulse 56 on lead 21 (in FIG. 3). The purpose of this delay is to prevent a possible race condition in the actuation rate limiter 10 which might otherwise occur if the signal pulse 56 were to force the triggering signal on lead 25 low immediately after it had gone high. The D-type flip-flop 11 is for example type 7474 Dual D flip-flop of Texas Instruments Incorporated. The specification of the minimum clock pulse required by the type 7474 D flip-flop is typically of the order of 30 nanoseconds.

Referring again to FIG. 3 the values of resistor 54 and capacitor 55 determine the width of signal pulse 56 on lead 21. Using the applicant's values of 70 K ohm for resistor 54 and 10 microfarads for capacitor 55, and making reference to the graph cited above, a pulse width of 500 milliseconds is obtained. The invention is in no way limited by these values. The appropriate pulse width may be determined for any desired application.

In FIG. 1 one can see that the signal on lead 21 is applied as one input to NOR gate 14 which is a type 7402 NOR gate available from Texas Instruments Incorporated. So long as the signal on lead 21 is at a low or zero logic level, the input clock signal 22 on lead 24 will appear inverted at the output of NOR gate 14 on lead 25, and be applied to the CLK input of flip-flop 11. However, during the time when the high or logic one level pulse 56 is present on lead 21, the signal at the output of NOR gate 14 will be a solid low or logic zero level, preventing subsequent triggerings of flip-flop 11.

Some restrictions on the relative durations of the signal pulses 46 and 56 and the period of input clock signal 22 may be apparent, but will be recited here for clarity. First, the duration of signal pulse 46 must be less than the period of input clock signal 22, otherwise a subsequent clock pulse will occur at the CLK input of flip-flop 11 before one-shot generator 13 has a chance to generate its inhibiting signal pulse 56. Second, the duration of signal pulse 56 in combination with the duration of signal pulse 46 must be greater than the period of input clock signal 22, or the inhibiting pulse 56 will go low before the next clock pulse, defeating the purpose of the actuation rate limiter 10. Third, although not a strict limitation, the period of input clock signal 22 should be sufficiently small that the actuating signal to load device 18 be able to respond within a short time after a legitimate level change of input signal 15.

The logic elements and signal polarities of this embodiment have been selected so as to prevent spurious triggerings of flip-flop 11 upon the application of signal pulse 56 on lead 21 to the input of NOR gate 14. If the signal on lead 25 at the output of NOR gate 14 is high, as it will be for the first one-half period of input clock signal 22 following the triggering of flip-flop 11, the occurrence of signal pulse 56 will drive the signal on lead 25 low, and it will remain at that zero logic level for the duration of signal pulse 56. If the signal on lead 25 at the output of NOR gate 14 is low, as it will be for the second half-period of input clock signal 22 following the triggering of flip-flop 11, the occurrence of signal pulse 56 will hold the signal on lead 25 at a low logic level. In neither case will the clocking signal on lead 25 be forced high by the occurrence of signal pulse 56.

A second embodiment of this invention is depicted in FIG. 4. It is a variation of the embodiment of FIG. 1, but it permits independent selection of the durations of signal pulse 46 (as shown in FIG. 1) for positive-going and negative-going transitions of the signal at the output of flip-flop 11.

In this embodiment there is a positive-going transition detector 61 and a negative-going transition detector 62, each generating a short negative signal pulse 63 and 64, respectively, on their respective output leads 65 and 66, upon detection of the appropriate transition. Positive-going transition detector 61 is for example like monostable multivibrator circuit 32, of FIG. 2, but with output signal pulse 63 derived from the $\overline{Q}$ output. Negative-going transition detector 62 is for example like monostable multivibrator circuit 31, of FIG. 2, but with output signal pulse 64 derived from the $\overline{Q}$ output. The separate signal pulses 63 and 64 are applied to two distinct one-shot generators 67 and 68, respectively, via leads 65 and 66, respectively. One-shot generators 67 and 68 are for example each like one-shot generator 13, depicted in detail in FIG. 3, and they generate positive signal pulses 69 and 70, respectively, of predetermined durations on leads 71 and 72, respectively, in response to low-to-high logic level transitions at their inputs. Signal pulses 69 and 70 are applied via leads 71 and 72, respectively, to the inputs of OR gate 73 which is for the example of a type 7432 2-input OR gate of Texas Instruments Incorporated, and which produces a positive signal pulse 74 on lead 79 in response to either signal pulse 69 or 70.

The advantage of separating positive-going transition detector 61 and one-shot generator 67 from negative-going transition detector 62 and one-shot generator 68 is apparent when one has a requirement that the duration of the inhibiting signal pulse 74 be different in response to a positive-going transition of the signal on lead 60 from the negative-going transition of the signal on that lead. Having two distinct one-shot generators 67 and 68 permits selection of resistors 75 and 76 and capacitors 77 and 78 such that the durations of pulses 69 and 70 are determinable and independent.

A possible use for this embodiment may be found in a transmitting circuit in which the presence of voice energy is used to key a relay. This circuit may require an actuation rate limiter to prevent excessive relay operation in some failure modes. It is, however, a requirement of a voice actuating circuit that the relay responds rapidly to the presence of voice. An actuation rate limiter which would inhibit the dropout of the relay from a period of time following a short burst of voice would be acceptable, but a sizeable delay in re-energizing the relay after a short period of no-voice would be unacceptable. This embodiment of the present invention permits the inhibit times following transitions from no-voice to voice and from voice to no-voice to be different. Specifically, the limiter would inhibit a change from a no-voice to a voice actuation for a relatively short period of time following the detection of no-voice, while a relatively long inhibit of a change from voice to no-voice would follow the detection of voice. Thus, protection is afforded to the relay while maintaining the level of operation required by this type of circuit.

The inventor has found application for his invention in the fields of radar and communications, but does not intend to imply that the application is thereby limited. Its use can be extended to any area in which the rate of actuation of a signal must be limited. Although the embodiments have been shown as comprising TTL digital logic elements, any appropriate electronic circuitry may be used to accomplish the same stated results.

What is claimed is:

1. An apparatus for limiting the rate at which transitions on an input signal are applied to the output thereof, said apparatus comprising:
    means responsive to said input signal for providing upon the occurrence of clock signals said input signal to said output,
    generating means coupled to said output of said first-mentioned means for generating a signal pulse of a first predetermined duration in response to particular changes of said input signal at said output,
    coupling means for providing said clock signals having a period less than said first predetermined duration to said first-mentioned means, and
    means coupled to said coupling means and responsive to said signal pulse for inhibiting the application of said clock signals to said first-mentioned means for the duration of said signal pulse and thereby inhibiting said input signal out of said first-mentioned means for said duration.

2. The apparatus of claim 1 wherein said first-mentioned means includes a D-type flip-flop.

3. The apparatus of claim 1 wherein said input signals are digital logic signals and said generating means is responsive to changes from low to high logic levels or high to low logic levels.

4. The apparatus as set forth in claim 1 wherein said generating means includes means for delaying the generation of said signal pulse a second predetermined duration less than said first predetermined duration and less than said period of said clock signals following said particular change.

5. The apparatus of claim 4 wherein said input signals are digital logic signals and said generating means is responsive to changes from low to high logic levels or high to low logic levels and said delay means includes means for producing a short duration pulse of said second predetermined duration in response to said particular changes of said input signal from low to high logic levels or high to low logic levels.

6. The apparatus of claim 5 wherein said generating means further includes means coupled to said delay means for providing in response to the trailing edge of said short duration pulse said signal pulse of said first predetermined duration.

7. The apparatus as set forth in claim 1 wherein said generating means includes a one-shot generator.

8. The apparatus as set forth in claim 1 wherein said inhibiting means is a NOR gate.

9. An apparatus for limiting the rate at which transitions on an input signal are applied to the output thereof, said apparatus comprising:

means responsive to said input signal for providing upon the occurrence of clock signals said input signal to said output, first generating means coupled to said output of said first-mentioned means for generating a first signal pulse of a first predetermined duration in response to positive-going transitions of said input signal at said output, second generating means coupled to said output of said first-mentioned means for generating a second signal pulse of a second different predetermined duration in response to negative-going transitions of said input signal at said output, coupling means coupled to said first-mentioned means for providing said clock signals having a period less than said first and second predetermined durations to said first-mentioned means, and means responsive to said first signal pulse and said second signal pulse for inhibiting the application of said clock signals to said first-mentioned means for the duration of said first signal pulse and said second signal pulse respectively.

* * * * *